(12) United States Patent
Lee et al.

(10) Patent No.: US 6,313,537 B1
(45) Date of Patent: Nov. 6, 2001

(54) SEMICONDUCTOR DEVICE HAVING MULTI-LAYERED PAD AND A MANUFACTURING METHOD THEREOF

(75) Inventors: Sueng-Rok Lee, Yongin; Myung-Sung Kim, Seoul; Yunhee Lee, Sungnam; Manjun Kim, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/209,315

(22) Filed: Nov. 9, 1998

(30) Foreign Application Priority Data

Dec. 9, 1997 (KR) .................................................. 97-66918

(51) Int. Cl.[7] .......................... H01L 23/98; H01L 23/52; H01L 29/40
(52) U.S. Cl. .......................... 257/758; 257/773; 257/786; 257/774; 257/775; 257/784; 257/788; 257/680; 257/700; 257/701
(58) Field of Search ..................................... 257/758, 773, 257/786, 774, 775, 784, 788, 680, 700, 701

(56) References Cited

U.S. PATENT DOCUMENTS

| | | | |
|---|---|---|---|
| 5,248,903 | * 9/1993 | Heim ...................... | 257/748 |
| 5,404,047 | * 4/1995 | Rostoker et al. ...................... | 257/786 |
| 5,502,337 | * 3/1996 | Nozaki ...................... | 257/773 |
| 5,736,791 | * 4/1998 | Fujiki et al. ...................... | 257/781 |
| 5,739,587 | * 4/1998 | Sato ...................... | 257/758 |
| 5,751,065 | * 5/1998 | Chittipeddi et al. ...................... | 257/758 |

FOREIGN PATENT DOCUMENTS 40-2026039 * 1/1990 (JP) .

* cited by examiner

*Primary Examiner*—Minh Loan Tran
*Assistant Examiner*—Luan Thai
(74) *Attorney, Agent, or Firm*—MargerJohnson & McCollom, P.C.

(57) ABSTRACT

Provided is a semiconductor device having a multi-layered pad, including a first interlevel insulating layer formed on a semiconductor substrate; a first conductive pad formed on the first interlevel insulating layer, the first conductive pad extending lengthwise along a first edge on a first side of a pad window region; a second interlevel insulating layer formed on the first interlevel insulating layer having a first via hole exposing a defined region of the first conductive pad; a first conductive plug formed in the first via hole; a second conductive pad formed on the second interlevel insulating layer, the second conductive pad extending lengthwise along the first edge on the first side of the pad window region and being electrically coupled to the first conductive plug; a third interlevel insulating layer formed on the second interlevel insulating layer having a second via hole exposing a defined region of the second conductive pad; a second conductive plug formed in the second via hole; and a third conductive pad formed on a defined region of the third interlevel insulating layer, the third conductive pad being electrically coupled to the second conductive plug. The semiconductor device further comprises a fourth interlevel insulating layer formed on the third interlevel insulating layer having a third via hole exposing a defined region of the third conductive pad and a fourth conductive pad formed on a defined region of the fourth interlevel insulating layer, the fourth conductive pad being electrically coupled to the third conductive pad. The semiconductor device even further comprises a plurality of buffer layers formed on at least one of the first and second interlevel insulating layers under the pad window region. The plurality of buffer layers is arranged either in a mosaic layout or in a zigzag manner.

8 Claims, 16 Drawing Sheets

SEMICONDUCTOR DEVICE HAVING MULTI-LAYERED PAD AND A MANUFACTURING METHOD THEREOF

BACKGROUND OF THE INVENTION

1. Field of the Invention

The present invention relates to a semiconductor device and a manufacturing method thereof. More particularly, the present invention relates to a semiconductor device having a multi-layered pad and a manufacturing method thereof that reduces cracks by optimizing the structure of a bonding pad.

2. Discussion of Related Art

Beginning with the development of deep sub-micron technology, a combination of W-plug, Al-flow, and Chemical Mechanical Polishing (CMP) processes is required in the manufacture of multi-layered wiring for semiconductor devices.

The W-plug process, used to produce multi-layered wiring, is needed to generate uniform contact holes or via contact holes during the CMP process in manufacturing semiconductor devices. The CMP process requires the use of a new bonding pad instead of conventional bonding pad having a wide via contact hole because many residual particles such as etching byproducts or slurry exist in the boundary of pad regions. This is particularly true when tungsten (W) is used in the CMP process with the conventional bonding pad. These residual particles adversely affect the adhesion of gold balls during wire bonding. Consequently, the gold balls exfoliate from the surface of the pad and increase the electrical resistance of the bonding pad.

FIG. 1 is a cross-sectional view of a semiconductor device having a conventional multi-layered pad formed using the W-plug process. In the figure, only the structure of the region of interest is shown. The semiconductor device having the multi-layered pad structure shown is fabricated in three steps.

In the fist step, a first interlevel insulating layer 22 is formed and planarized in the pad forming region on a semiconductor substrate. The semiconductor substrate includes a field oxide layer (not shown), transistors (not shown), and capacitors (not shown). A first conductive pad 24 consisting of an Al or a Cu alloy is formed in the pad forming region on the first interlevel insulating layer 22. A second interlevel insulating layer 28 consisting of an oxide material is formed on the first conductive pad 24. The second interlevel insulating layer 28 is then selectively etched to form a first plurality of via holes 26, exposing a defined part of the first conductive pad 24 for electrical connection to a second conductive pad that will be formed later. To facilitate the subsequent step of depositing a conductive layer consisting of tungsten (W), a barrier metal layer (not shown) having a Ti/TiN laminated structure is formed only in the via holes 26. The tungsten (W) conductive layer is formed on the second interlevel insulating layer 28 using a Chemical Vapor Deposition (CVD) method and planarized using the CMP method. By doing so a first tungsten (W) plug 27 is formed in the first plurality of via holes 26.

In the second step, a second conductive pad 30 consisting of an Al or a Cu alloy is formed on a defined region of the second interlevel insulating layer 28 for electrical connection to the first tungsten (W) plug 27. Analogously to the first step, a third interlevel insulating layer 34 having a second plurality of via holes 32 is formed on the second interlevel insulating layer 28. In this manner, a second tungsten (W) plug 33 is formed in the second plurality of via holes 32.

In the third step, a third conductive pad 36 consisting of an Al or a Cu alloy is formed on a defined region of the third interlevel insulating layer 34 for electrical connection to the second tungsten (W) plug 33. Then, a protective layer 38 is disposed on a defined region of the third conductive pad 36 and the third interlevel insulating layer 34, exposing the third conductive pad 36 that forms a pad window region 40. The pad window region 40 is used to wire bond Au balls or Au bumps.

FIG. 2 is a top plan view of the multi-layered pad for the semiconductor device shown in FIG. 1. Referring to FIG. 2, the first to third conductive pads 24, 30, and 36, respectively, underlying the pad window region 40 are electrically connected with one another through the tungsten (W) plugs 27 and 33 formed in the first and second plurality of via holes 26 and 32, respectively, of the first and second interlevel insulating layers 28 and 34, respectively. Thus, the conductive pads and the leads (not shown) are wire-bonded via the pad window region 40 defined on the third conductive pad 36.

FIG. 1 is a cross-sectional view taken along the line I—I of FIG. 2, wherein reference numeral 10a denotes the pad forming region and reference numeral 10b indicates the connection between a cell and the pad forming region 10a.

When using the multi-layered pad as shown in the cross-sectional view of FIG. 1, it may be somewhat possible to prevent the exfoliation of gold balls from the surface of pads and the consequent increase of electrical resistance of the bonding pad. However, the conductive pads are placed under mechanical stress by the probing that occurs during device testing. The mechanical stress often causes cracks 42 to appear in the interlevel insulating layers. Such cracks may also appear during wire bonding where the overlying conductive pad 18 and leads (not shown) are electrically connected in the pad window.

Since the soft conductive pad—consisting of an Al alloy—is interposed between the hard interlevel insulating layers, the stress applied in the direction indicated by the arrow shown in FIG. 1 causes a distortion of the conductive pad that creates cracks 42 in the pad and interlevel insulating layers. This phenomenon is similar to breaking glass positioned between two cushions. The cracks 42 produced in the interlevel insulating layers may create wire bonding defects or the deterioration of assembly characteristic of the semiconductor package.

SUMMARY OF THE INVENTION

Accordingly, the present invention is directed to a semiconductor device having a multi-layered pad and a manufacturing method thereof that substantially obviates the problems associated with the prior art semiconductor devices having multi-layered pads.

An object of the present invention is to provide a semiconductor device having a multi-layered pad and a manufacturing method thereof designed to reduce cracks in the interlevel insulating layers during wire bonding or test probing by optimizing the structure of a bonding pad. In this manner, the assembly characteristics and reliability of the semiconductor package are improved.

According to a preferred embodiment of the present invention, there is provided a semiconductor device having a multi-layered pad, comprising a first interlevel insulating layer formed on a semiconductor substrate; a first conductive pad formed on the first interlevel insulating layer, the first conductive pad extending lengthwise along a first edge on a first side of a pad window region; a second interlevel insulating layer formed on the first interlevel insulating layer having a first via hole exposing a defined region of the first conductive pad; a first conductive plug formed in the first via hole; a second conductive pad formed on the second interlevel insulating layer, the second conductive pad extending lengthwise along the first edge on the first side of the pad window region and being electrically coupled to the first conductive plug; a third interlevel insulating layer formed on the second interlevel insulating layer having a second via hole exposing a defined region of the second conductive pad; a second conductive plug formed in the second via hole; and a third conductive pad formed on a defined region of the third interlevel insulating layer, the third conductive pad being electrically coupled to the second conductive plug.

The semiconductor device further comprises a fourth interlevel insulating layer formed on the third interlevel insulating layer having a third via hole exposing a defined region of the third conductive pad and a fourth conductive pad formed on a defined region of the fourth interlevel insulating layer, the fourth conductive pad being electrically coupled to the third conductive pad.

The semiconductor device even further comprises a plurality of buffer layers formed on at least one of the first and second interlevel insulating layers under the pad window region. The plurality of buffer layers is arranged either in a mosaic layout or in a zigzag manner.

According to another preferred embodiment of the present invention, there is provided a semiconductor device having a multi-layered pad, comprising a first interlevel insulating layer formed on a semiconductor substrate, the substrate having a first, second, and third regions; a first conductive pad formed on the second region of the substrate over the first interlevel insulating layer; a second interlevel insulating layer formed on the first interlevel insulating layer having a first via hole exposing a predetermined region of the first conductive pad, the first via hole having a bar form; a first conductive plug formed in the first via hole; a second conductive pad formed on the second region of the substrate over the second interlevel insulating layer, the second conductive pad being electrically coupled to the first conductive plug; a third interlevel insulating layer formed on the second interlevel insulating layer having a second via hole exposing a predetermined region of the second conductive pad, the second via hole having the bar form; a second conductive plug formed in the second via hole; and a third conductive pad formed on the first and second regions of the substrate over the third interlevel insulating layer, the third conductive pad being electrically coupled to the second conductive plug.

According to yet another preferred embodiment of the present invention, there is provided a semiconductor device having a multi-layered pad, comprising a first interlevel insulating layer formed on a semiconductor substrate; a first conductive pad formed on the first interlevel insulating layer, the first conductive pad having a plurality of through holes; a second interlevel insulating layer formed on the first interlevel insulating layer, the second interlevel insulating layer having a first via hole exposing a predetermined region of the first conductive pad at the edge of a pad window region; a first conductive plug formed in the first via hole; a second conductive pad formed on the second interlevel insulating layer, the second conductive pad having a closed curve form and being electrically coupled to the first conductive plug; a third interlevel insulating layer formed on the second interlevel insulating layer, the third interlevel insulating layer having a second via hole exposing a predetermined region of the second conductive pad; a second conductive plug formed in the second via hole; and a third conductive pad formed on the third interlevel insulating layer, the third conductive pad being electrically coupled to the first conductive plug.

The semiconductor having the multi-layered pad as constructed above disperses the stress imposed on the conductive pads during wire bonding or test probing thus decreasing possible cracks in the conductive pads and the interlevel insulating layers.

It is to be understood that both the foregoing general description and the following detailed description are merely exemplary and explanatory and are intended to provide further explanation of the invention as claimed.

BRIEF DESCRIPTION OF THE DRAWINGS

The foregoing and other objects, features, and advantages of the invention will become more readily apparent from the following detailed description of a preferred embodiment that proceeds with reference to the following drawings.

DETAILED DESCRIPTION OF PREFERRED EMBODIMENT

Optimized structures of a bonding pad according to the present invention may be classified into five types, each of which is realized in a semiconductor device having a multi-layered pad as shown in the cross-sectional views of FIGS. 3, 5, 7, 9, and 11, respectively.

Figure 1:
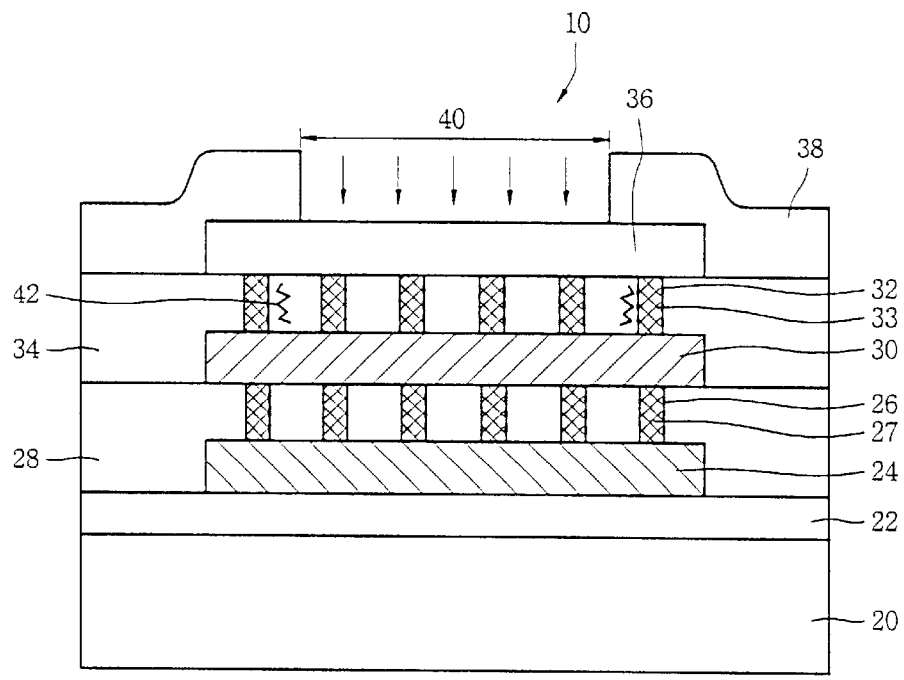
FIG. 1 is a sectional view of a semiconductor device having a conventional multi-layered pad.
Figure 2:
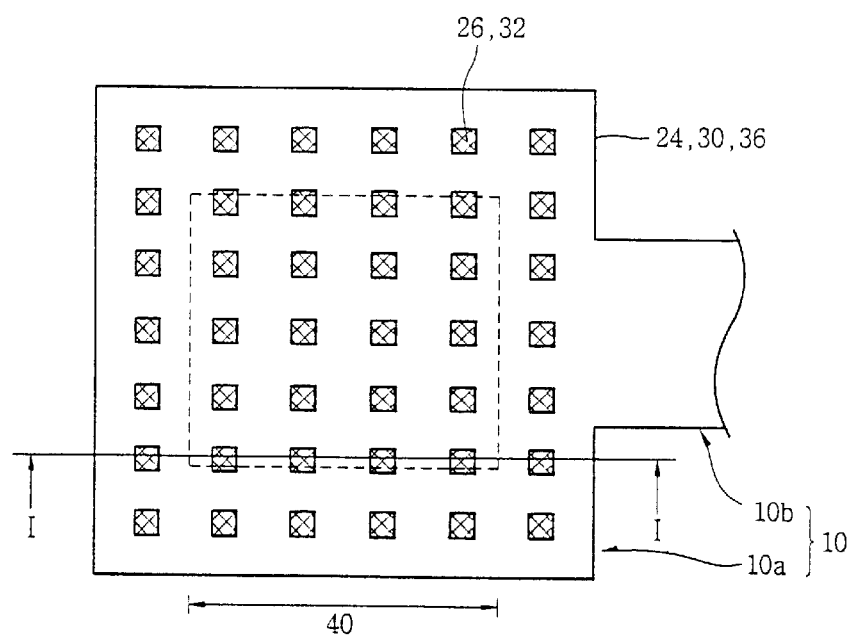
FIG. 2 is a plan view of the semiconductor device shown in FIG. 1.
Figure 3:
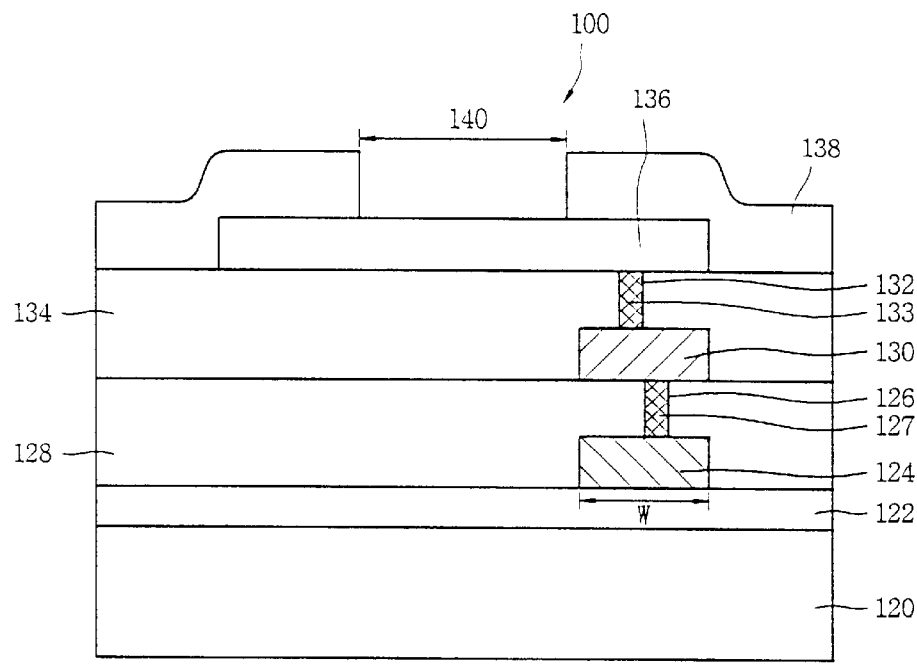
FIG. 3 is a sectional view of a semiconductor device having a multi-layered pad according to a first preferred embodiment of the present invention.

FIG. 3 is a sectional view of a semiconductor device having a multi-layered pad in accordance with a first preferred embodiment of the present invention. Referring to FIG. 3, the semiconductor device comprises a semiconductor substrate 120, a first interlevel insulating layer 122 formed on the semiconductor substrate 120 and a pad window region 140. A first conductive pad 124 is disposed in a pad forming portion on the first interlevel insulating layer 122, i.e., a defined region of the first interlevel insulating layer 122. The first conductive pad 124 extends lengthwise along the edge on one side of the pad window region 140. A second interlevel insulating layer 128 is formed on the first interlevel insulating layer 122 including the first conductive pad 124. The second interlevel insulating layer 128 includes a first via hole 126. The first via hole 126 exposes a defined region of the first conductive pad 124. A first conductive plug 127 is disposed in the first via hole 126. A second conductive pad 130 is formed on a defined region of the second interlevel insulating layer 128. A third interlevel insulating layer 134 is formed on the second interlevel insulating layer 128 including the second conductive pad 130. The third interlevel insulating layer 134 includes a second via hole 132. The second via hole 132 exposes a defined region of the second conductive pad 130. A second conductive plug 133 is disposed in the second via hole 132. A third conductive pad 136 is formed on a defined region of the third interlevel insulating layer 134 and connected to the second conductive plug 133. A protective layer 138 is formed on the third interlevel insulating layer 134 including the third conductive pad 136. The protective layer 138 exposes a defined region of the third conductive pad 136. The exposed part of the third conductive pad 136 defines the pad window region 140 where the conductive pad will be bonded to wires.

Figure 4A:
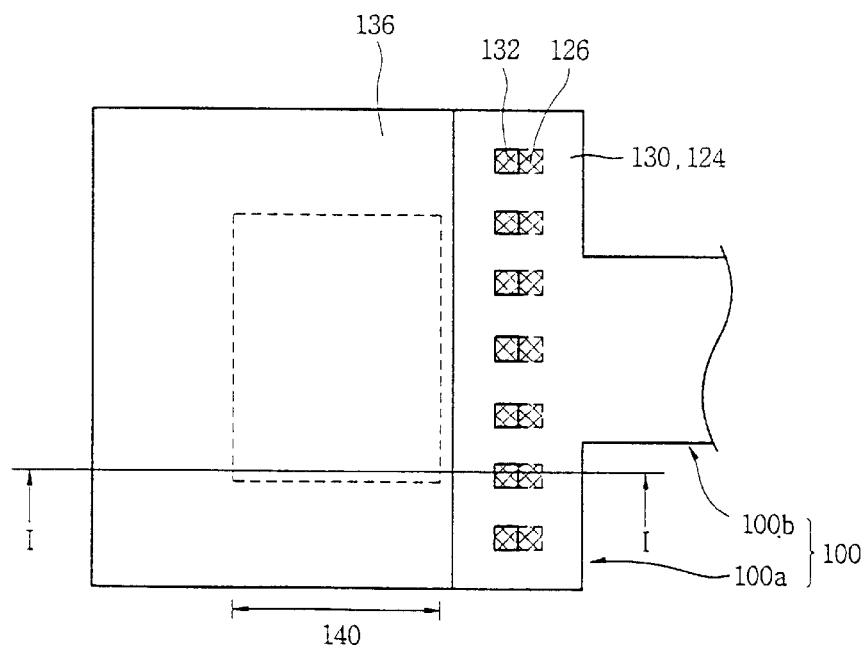
FIGS. 4a to 4d are top plan views of the semiconductor device shown in FIG. 3.
Figure 4B:
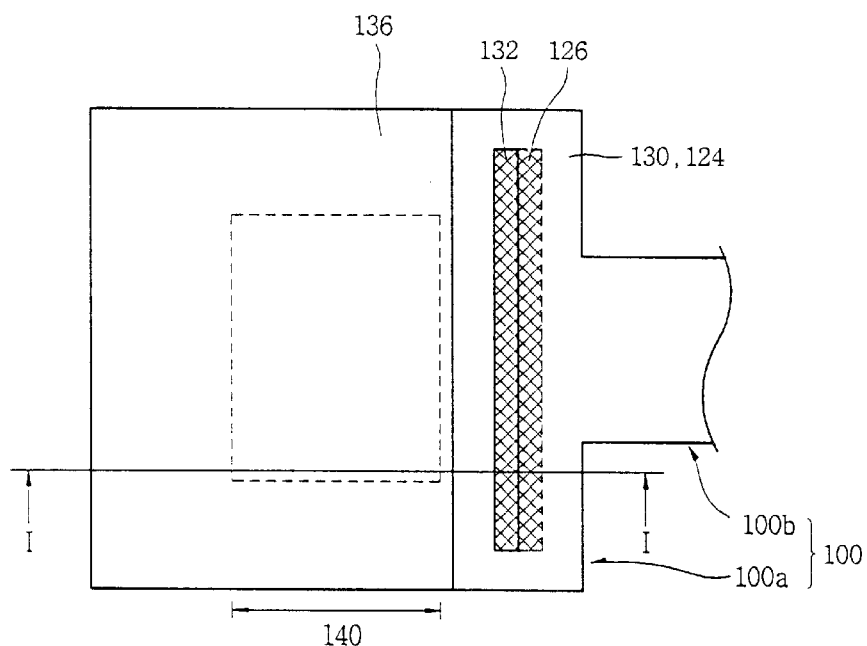
Figure 4C:
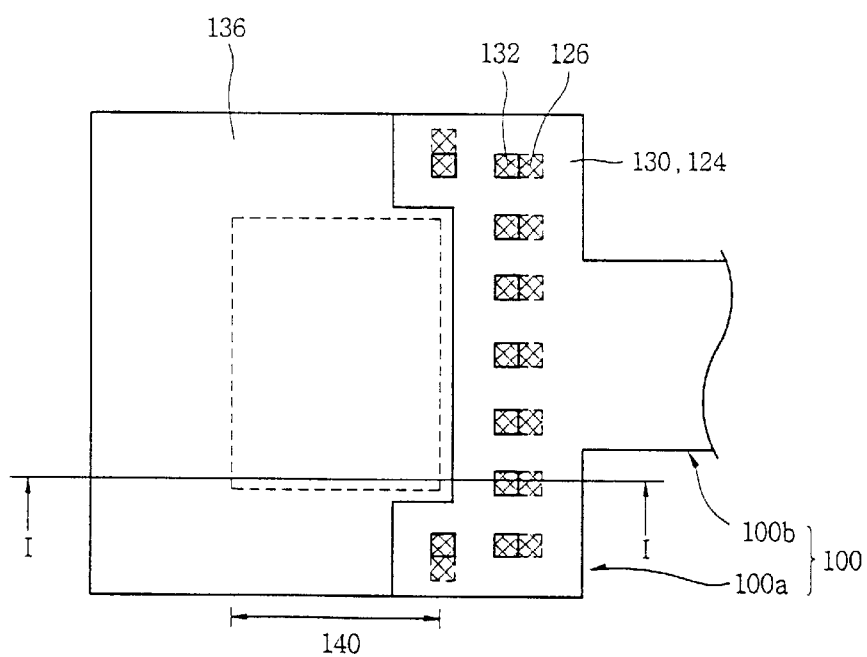

As shown in FIG. 3, the pad window region 140 is formed to the right of the conductive pads and only above the conductive pad 136. The structures of first and second conductive pads 124 and 130, respectively, may have some differences in each figure; for example, they may extend lengthwise along the edge on one side of the pad window region 140, as shown in FIG. 4a. They may not only extend lengthwise along the edge of one side of the pad window region 140 but also have both ends extending to another side of the pad window region 140, as shown in FIG. 4c.

Figure 4D:
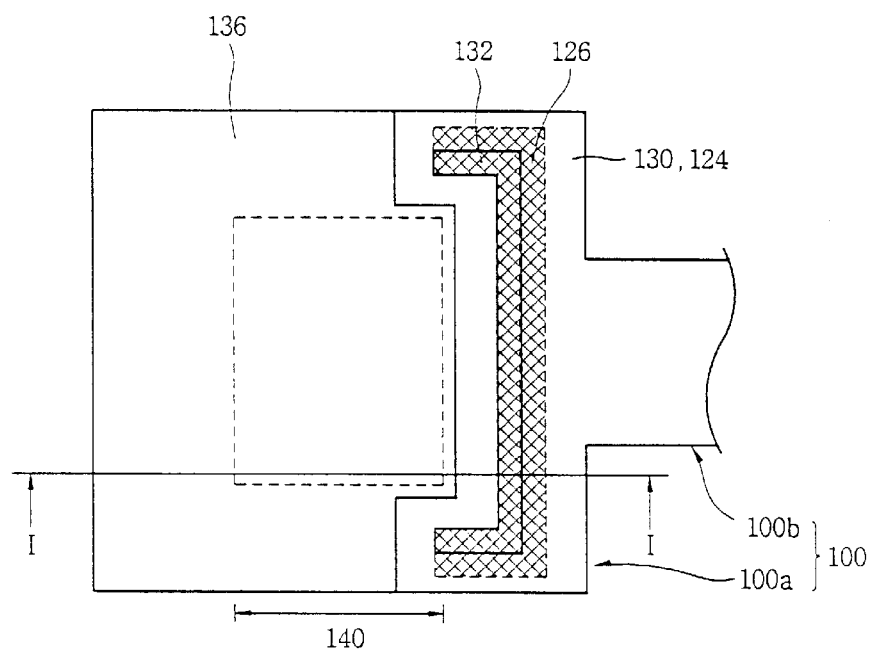

There may be various layouts of the first and second via holes 126 and 132 insofar as they can provide an electrical connection of the first to third conductive pads 124, 130, and 136; respectively. For example, the first via hole 126 and the second via hole 132 are arranged in the form of an edge array as shown in FIGS. 4a and 4c or in the bar form as shown in FIGS. 4b and 4d. In these figures, the first and second via holes 126 and 132, respectively, formed in the second and third interlevel insulating layers 128 and 134, respectively, are alternately disposed in a zigzag manner but they may also be arranged along a straight line. FIG. 3 is a sectional view taken along the line I—I of FIGS. 4a–4d wherein reference numeral 100a donates a pad forming portion and reference numeral 100b designates a connection between a cell and the pad forming portion.

Figure 13A:
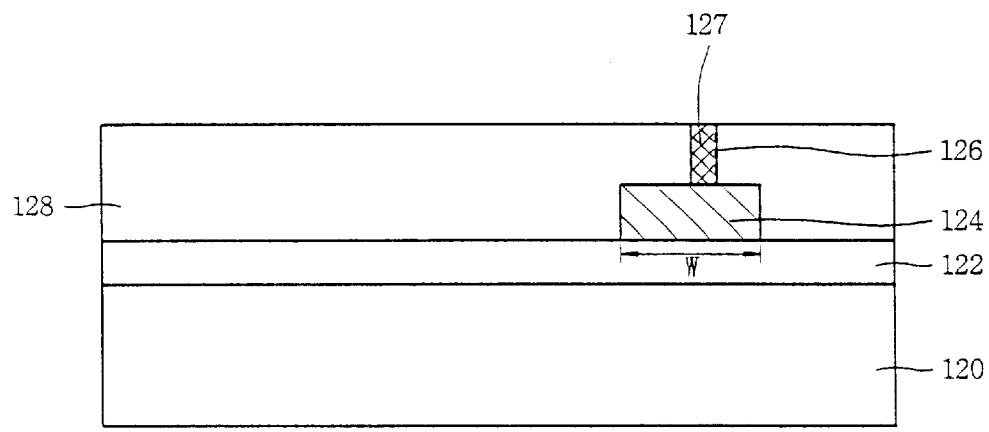
FIGS. 13a to 13c are sequential diagrams of a method for manufacturing the semiconductor device having multi-layered pad according to the first embodiment of the present invention.

The semiconductor device having such a structure of the multi-layered pad is fabricated in three steps. The three steps will be described with reference to the sequential diagrams of FIGS. 13a–13c as follows. Referring to FIG. 13a, a first interlevel insulating layer 122 having a thickness of 9000 to 12000 Å is formed and planarized on a semiconductor substrate 120 having a field oxide layer (not shown), transistors (not shown), and capacitors (not shown). A conductive layer consisting of an Al or a Cu alloy 5500 to 6500 Å thick is deposited on the entire surface of the first interlevel insulating layer 122. The conductive layer is then coated with a reflection preventing layer (not shown) having a laminated TiN or Ti/TiN structure of 200 to 350 Å, and selectively etched by using an etching mask which defines the edge on the one side of a pad window region 140. Accordingly a first conductive pad 124 having a width w of 2 to 5 μm is formed extending lengthwise along the edge on the one side of the pad window region 140. On the first interlevel insulating layer 122 including the first conductive pad 124 is disposed and planarized a second interlevel insulating layer 128 consisting of an oxide material 15000 to 17000 Å thick. The second interlevel insulating layer 128 is selectively photo-etched, forming a first via hole 126. The first via hole 126 exposes a defined region of the first conductive pad 124. A conductive layer consisting of tungsten (W), aluminum or a copper alloy is deposited on the second interlevel insulating layer 128 including the first via hole 126 using a CVD method and planarized using a CMP method thereby forming a first conductive plug 127 in the first via hole 126. Where the conductive plug 127 comprises tungsten (W), a further barrier metal layer (not shown) having a Ti/TiN laminated structure is required in the first via hole 126 with the view to enhancing the deposition property of the layers.

Figure 13B:
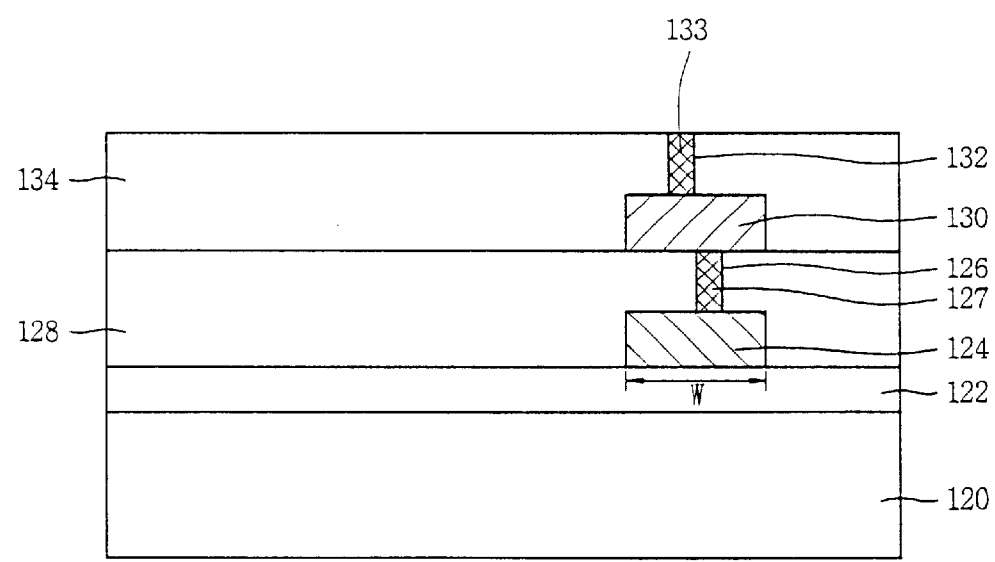

Referring to FIG. 13b, a second conductive pad 130 is formed on a defined part of the second interlevel insulating layer 128 in the same manner as that shown in FIG. 13a. The second conductive pad 130 extends lengthwise along the edge on the one side of the pad window region 140 for connection with the first conductive plug 127. Similar to the first conductive pad 124, the second conductive pad 130 is formed with a width in the 2 to 5 μm range and has an overlying reflection preventing layer (not shown). On the second interlevel insulating layer 128 including the second conductive pad 130 is disposed a third interlevel insulating layer 134 consisting of an oxide material 14000 to 16000 Å thick. The third interlevel insulating layer 134 is selectively photo-etched to form a second via hole 132. The second via hole 132 exposes a defined region of the second conductive pad 130. A conductive layer consisting of tungsten (W), aluminum, or a copper alloy is deposited on the third interlevel insulating layer 134 including the second via hole 132 using the CVD method and planarized using the CMP method thereby forming a second conductive plug 133 in the second via hole 132. Where the conductive plug 133 comprises tungsten (W), a barrier metal layer (not shown) having a Ti/TiN laminated structure is required in the second via hole 132 with the view to enhancing the deposition property of the layers.

Figure 13C:
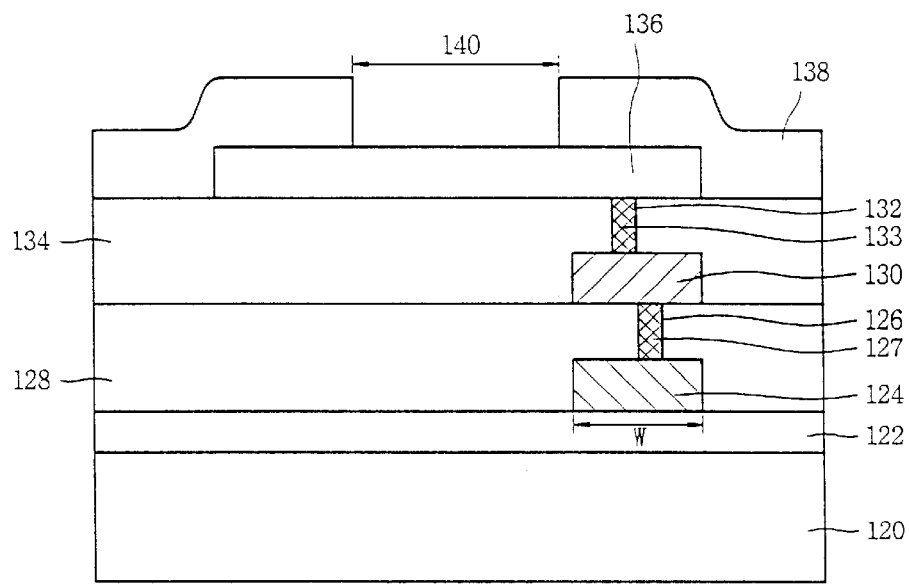

Referring to FIG. 13c, a third conductive pad 136 is formed in a similar manner to the first step shown in FIG. 13a on a defined region of the third interlevel insulating layer 134. The third interlevel insulating layer 134 has a reflection-preventing layer (not shown) for connection with the second conductive plug 133. A protective layer 138 is disposed on the third interlevel insulating layer 134 including the third conductive pad 136. The protective layer 138 defines a region in the third conductive pad 136 completing the multi-layered pad 100 for the semiconductor device having multi-layered wiring.

In the above-described structure, the first and second conductive pads are disposed only on one of the four sides of the pad window region. By so forming the conductive pads, it is possible to decrease the stress imposed on the first and second conductive pads by a quarter, that even when the wire bonding is turned aside from the center of pad window region 140. The reduction in pad stress further reduced the number of cracks in the interlevel insulating layers by a quarter.

Figure 5:
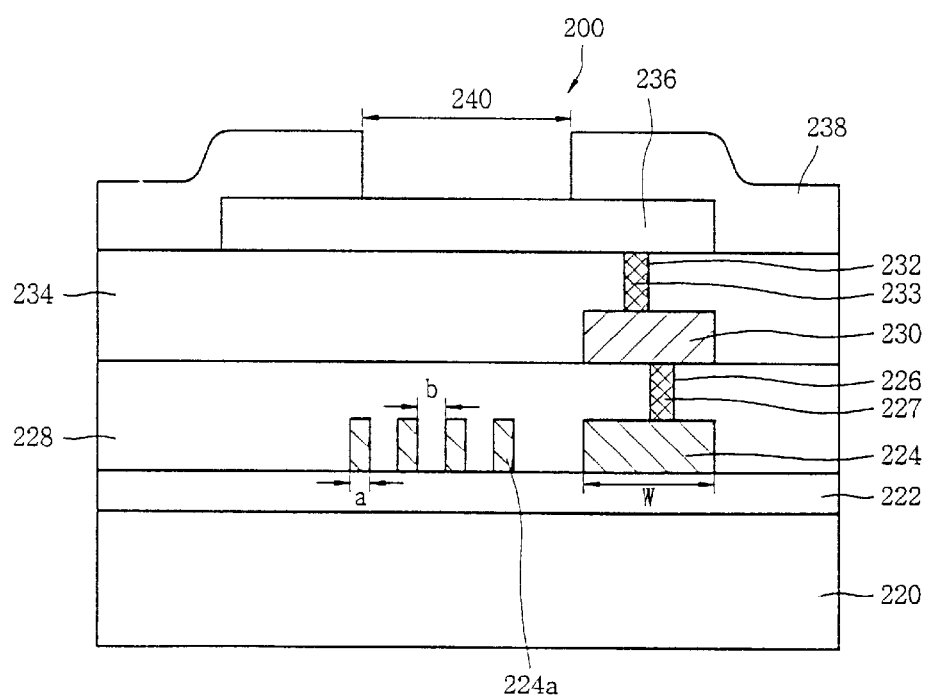
FIG. 5 is a sectional view of a semiconductor device having a multi-layered pad according to a second preferred embodiment of the present invention.

FIG. 5 is a sectional view of a semiconductor device having a multi-layered pad in accordance with a second preferred embodiment of the present invention. Referring to FIG. 5, the structure and the manufacturing process of the semiconductor device is analogous to the first preferred embodiment with the exception that varying number of buffer layers 224a are formed in the mosaic layout on at least one of the first and second interlevel insulating layers 222 and 228 under the pad window region 240. Buffer layers 224a are shown in FIG. 5 only on the first interlevel insulating layer 22. However, additional buffer layers may also be disposed on the second interlevel insulating layer 228. Buffer layers 224a may be arranged either in the same mosaic layout or alternately disposed in a zigzag manner on the first and second interlevel insulating layers 222 and 224.

The distance b between the two adjacent buffer layers 224a is preferably in the range of 0.7 to 0.8 μm, with each of buffer layers 224a being 0.4 to 0.6 μm in width a and consisting of a material different from that used in the first to third interlevel insulating layers 222, 228 and 234, respectively. For example, the buffer layers 224a may be formed of aluminum, a copper alloy, or polysilicon.

Figure 6:
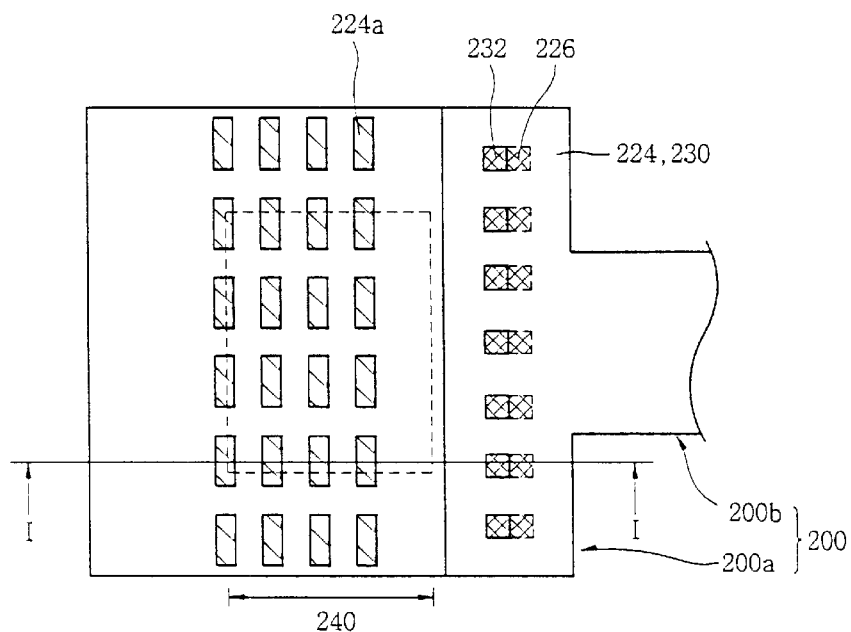
FIG. 6 is a plan view of the semiconductor device shown in FIG. 5.

FIG. 6 is a top plan view of the semiconductor device having the multi-layered pad shown in FIG. 5. As seen in FIG. 6, the pad window region 240 is formed to the right of the first and second via holes 226 and 232, respectively, and has an optional number of underlying buffer layers 224a. It is also possible to dispose the first and second via holes 232 and 226 in either an edge array or a bar layout. FIG. 5 is a sectional view taken along the line I—I of FIG. 6. Reference numeral 200a in FIG. 6 denotes a pad forming portion and reference numeral 200b designates a connection between a cell and the pad forming portion.

Figure 14A:
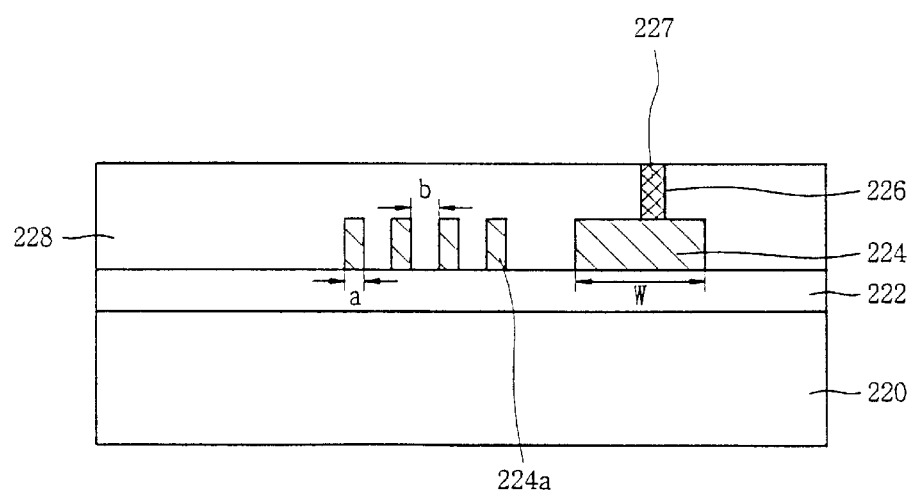
FIGS. 14a to 14c are sequential diagrams of a method for manufacturing the semiconductor device having multi-layered pad according to the second embodiment of the present invention.
Figure 14B:
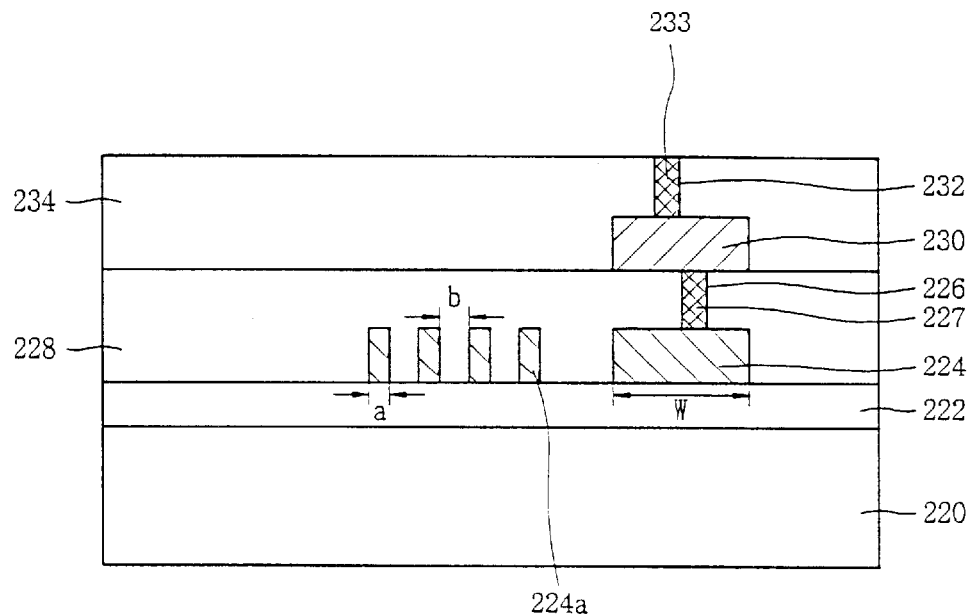
Figure 14C:
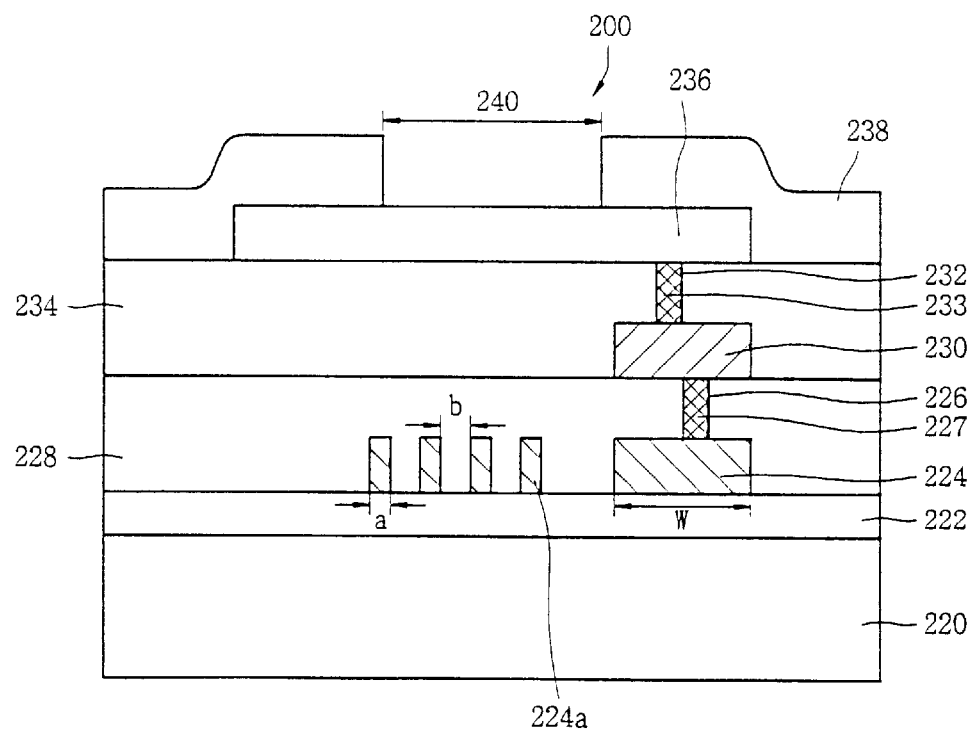

The semiconductor device having the multi-layered pad shown in FIG. 5 is fabricated in three step that will be described with reference to the sequential diagrams of FIGS. 14a–14c. In FIGS. 14a–14c, the buffer layers are shown formed only on a first interlevel insulating layer 222. Referring to FIG. 14a, a first interlevel insulating layer 222 having a thickness between 9000 to 12000 Å is formed and planarized on a semiconductor substrate 220 having a field oxide layer (not shown), transistors (not shown), and capacitors (not shown). A first conductive pad 224 is deposited the entire surface of the first interlevel insulating layer 222. The first conductive pad 224 extends lengthwise along the edge of one side of a pad window region 240. Buffer layers 224a consisting of the same material as the first conductive pad 224 are formed concurrently with the first conductive pad 224. If the buffer layers 224a are made from a material different than that of the first conductive pad 224 such as polysilicon, they are formed by separate deposition and photo-etching steps. A second interlevel insulating layer 228 15000 to 17000 Å thick is formed on the first interlevel insulating layer 222. The second interlevel insulating layer 228 includes a first via hole 226 that exposes a defined region of the first conductive pad 224. A first conductive plug 227 consisting of tungsten (W), aluminum, or a copper alloy is then formed in the first via hole 226. Where the conductive plug 227 comprises tungsten (W), a barrier metal layer (not shown) having a Ti/TiN laminated structure is required in the first via hole 226 with the view to enhancing the deposition property of the layers.

Referring to FIG. 14b, a second conductive pad 230 is formed on a defined region of the second interlevel insulating layer 228 in the same manner as that shown in FIG. 14a. The second conductive pad 230 extends lengthwise along the edge one side of the pad window region 240 for connection with the first conductive plug 227. On the second interlevel insulating layer 228 including the second conductive pad 230 is disposed a third interlevel insulating layer 234 in the 14000 to 16000 Å thick. The third interlevel insulating layer 234 has a second via hole 232 that exposes a defined region of the second conductive pad 230. A second conductive plug 233 consisting of tungsten (W), aluminum, or a copper alloy is formed in the second via hole 232. Where the conductive plug 233 comprises tungsten (W), a barrier metal layer (not shown) having a Ti/TiN laminated structure is required in the second via hole 232 with the view to enhancing the deposition property of the layers.

Referring to FIG. 14c, a third conductive pad 236 is formed on a defined region of the third interlevel insulating layer 234 for connection with the second conductive plug 233. A protective layer 238 is formed on a defined region of the third conductive pad 236 and the third interlevel insulating layer 234. The protective layer 238 exposes a defined region of the third conductive pad 236 thereby completing the multi-layered pad 200 of the semiconductor device. In the above-described structure, buffer layers 224a disperse the externally imposed stress thereby preventing cracks. Because the buffer layers and the interlevel insulating layers are made of different materials, the ability to absorb the force that causes the stress is different.

Figure 7:
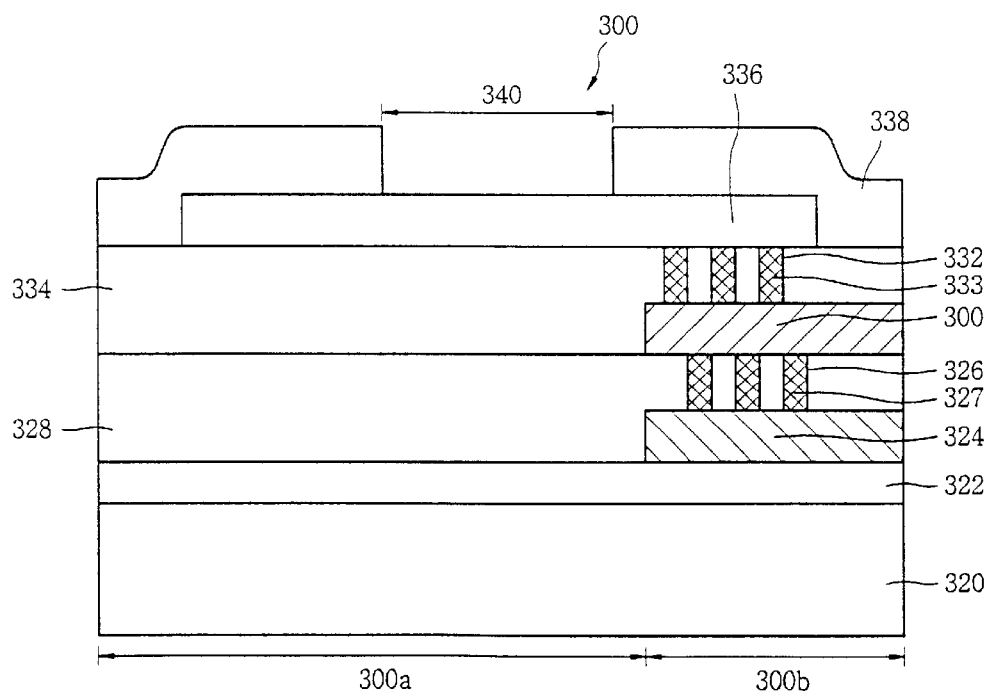
FIG. 7 is a sectional view of a semiconductor device having a multi-layered pad according to a third preferred embodiment of the present invention.

FIG. 7 is a sectional view of a semiconductor device having a multi-layered pad in accordance with a third preferred embodiment of the present invention. The third embodiment differs from the first and second embodiments in that the multi-layered pad is disposed on a connection region (hereinafter, referred to as a second region) 300b for connecting a pad forming portion (hereinafter, referred to a first region) 300a and a cell forming portion (hereinafter, referred to a second region) 300b. This is intended to prevent conductive pads, forming a bonding pad, and interlevel insulating layers from being affected by the external stress imposed during wire bonding or electrical testing.

Referring to FIG. 7, the semiconductor device having the multi-layered pad according to the third preferred embodiment of the present invention comprises a semiconductor substrate 320 and a first interlevel insulating layer 322 formed on the first to third regions on the semiconductor substrate 320. A first conductive pad 324 is formed on the second region 300b on the first interlevel insulating layer 322. A second interlevel insulating layer 328 is formed on the first interlevel insulating layer 322 including the first conductive pad 324. The second interlevel insulating layer 328 includes a first via hole 326 a defined region of the first conductive pad 324. A first conductive plug 327 is disposed in the first via hole 326. A second conductive pad 330 is formed in the second region 300b on the second interlevel insulating layer 328 and is electrically connected to the first conductive plug 327. A third interlevel insulating layer 334 is formed on the second interlevel insulating layer 328 including the second conductive pad 330. The third interlevel insulating layer 334 includes a second via hole 332 that exposes a defined region of the second conductive pad 330. A second conductive plug 333 is formed on the third interlevel insulating layer 334. A third conductive pad 336 is formed across the first and second regions on the third interlevel insulating layer 334 and is electrically connected to the second conductive plug 333. A protective layer 338 is formed on the third interlevel insulating layer 334 including the third conductive pad 336. The protective layer 338 exposes a defined region of the third conductive pad 336. The exposed part of the third conductive pad 336 is pad window region 340 where the conductive pads and leads will be bonded together via wires.

Figure 8:
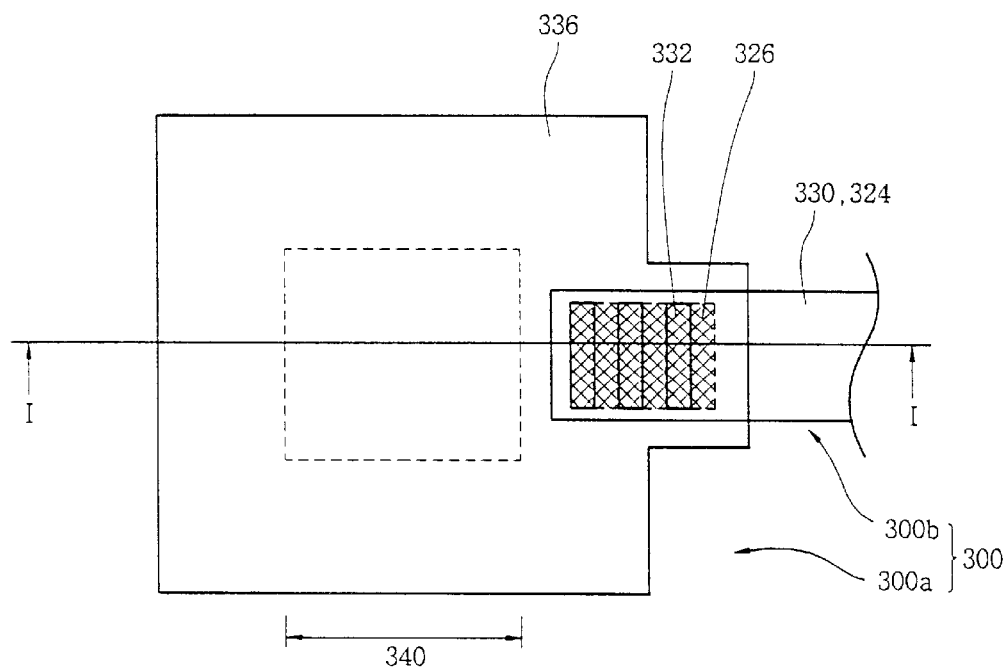
FIG. 8 is a plan view of the semiconductor device shown in FIG. 7.

FIG. 8 is a top plan view of the semiconductor device having the multi-layered pad shown in FIG. 7. As shown in FIG. 7, the pad window region 340 is formed to the right, the first region 300a of the semiconductor substrate. The conductive plugs electrically connect the first and second conductive pads 324 and 330 electrically in the second region 300b on the semiconductor substrate. The first and second via holes 326 and 332 are produced in bar form to increase the contact area of the via holes thereby reducing the contact resistance.

In the second and third interlevel insulating layers 328 and 334, the first and second via holes 326 and 332 are alternately disposed in a zigzag manner as shown in FIG. 8, but may also be arranged in a straight line. Reference numeral 300a shown in FIG. 7 denotes the first region, i.e., a pad forming portion and reference numeral 300b denotes the second region, i.e., the connection between a cell and the pad forming portion.

Figure 15A:
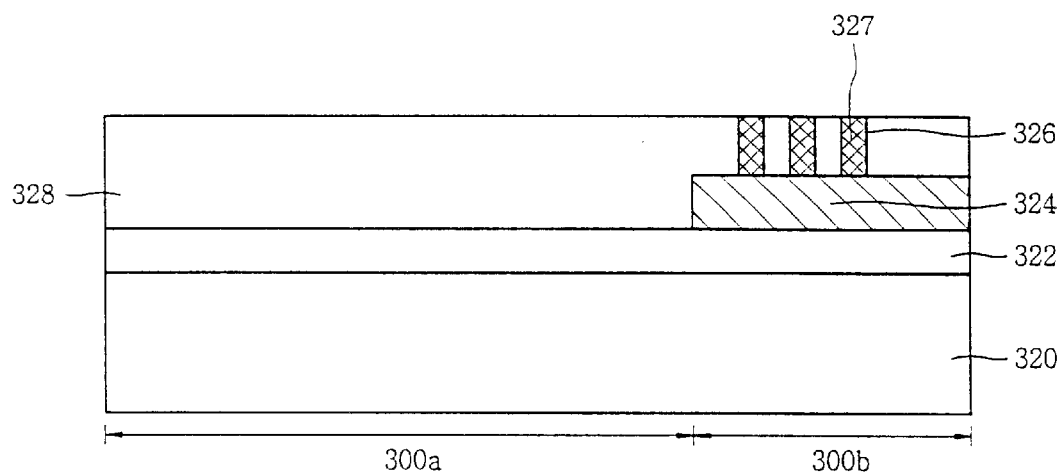
FIGS. 15a to 15c are sequential diagrams of a method for manufacturing the semiconductor device having multi-layered pad according to the third embodiment of the present invention.

The semiconductor device having the above-described multi-layered pad structure is fabricated in three steps that will be described with reference to the sequential diagrams of FIGS. 15a–15c as follows. Referring to FIG. 15a, a first interlevel insulating layer 322, 9000 to 12000 Å thick, is formed and planarized on a semiconductor substrate 320 having a field oxide layer (not shown), transistors (not shown), and capacitors (not shown). A conductive layer consisting of an Al or a Cu alloy 5500 to 6500 Å thick is deposited on the entire surface of the first interlevel insulating layer 322. The conductive layer is then coated with a reflection preventing layer (not shown) having a laminated TiN or Ti/TiN structure 200 to 350 Å thick. The conductive layer is selectively etched to expose the first region 300a (pad forming region) of the first interlevel insulating layer. As a result, a first conductive pad 324 is disposed only in a second region of the first interlevel insulating layer 322. A second interlevel insulating layer 328 consisting of an oxide material 15000 to 17000 Å thick is disposed and planarized on the first interlevel insulating layer 322. The second interlevel insulating layer 328 is selectively photo-etched thereby forming a first via hole 326. The first via hole 326 exposes a defined region of the first conductive pad 324. A conductive layer consisting of tungsten (W), aluminum, or a copper alloy is deposited on the second interlevel insulating layer 328 including the first via hole 326 using the CVD method and planarized sin the CMP method thereby forming a first conductive plug 327 in the first via hole 326. Where the conductive plug 327 comprises tungsten (W), a barrier metal layer (not shown) having a Ti/TiN laminated structure is required in the first via hole 326 with the view to enhancing the deposition property of the layers.

Figure 15B:
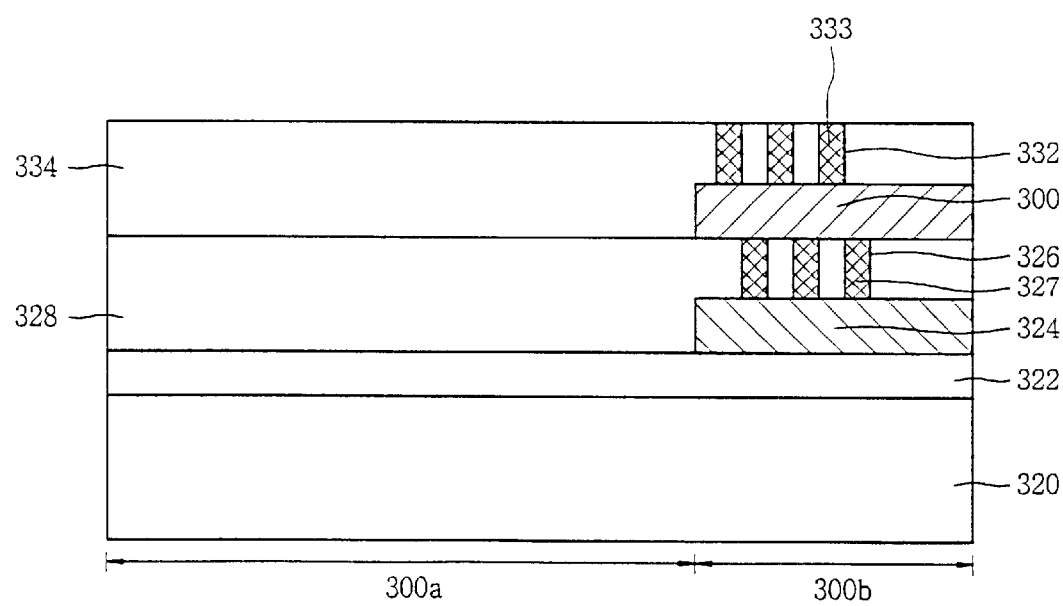

Referring to FIG. 15b, a second conductive pad 330 is formed in the second region 300b on the second interlevel insulating layer 328 in the same manner as that shown in FIG. 15a. The second conductive pad 330 is electrically connected to the first conductive plug 327. On the second interlevel insulating layer 328 including the second conductive pad 330 is disposed and planarized a third interlevel insulating layer 334 consisting of an oxide material 14000 to 16000 Å thick. The third interlevel insulating layer 334 is a selectively photo-etched thereby forming a second via hole 332 and exposing a defined region of the second conductive pad 330. A second conductive pad 332 consisting of tungsten (W), aluminum, or a copper alloy is then formed in the second via hole 332. Where the conductive plug 333 comprises tungsten (W), it is necessary to further form a barrier metal layer (not shown) having a Ti/TiN laminated structure is required in the second via hole 332 with the view to enhancing the deposition property of the layers.

Figure 15C:
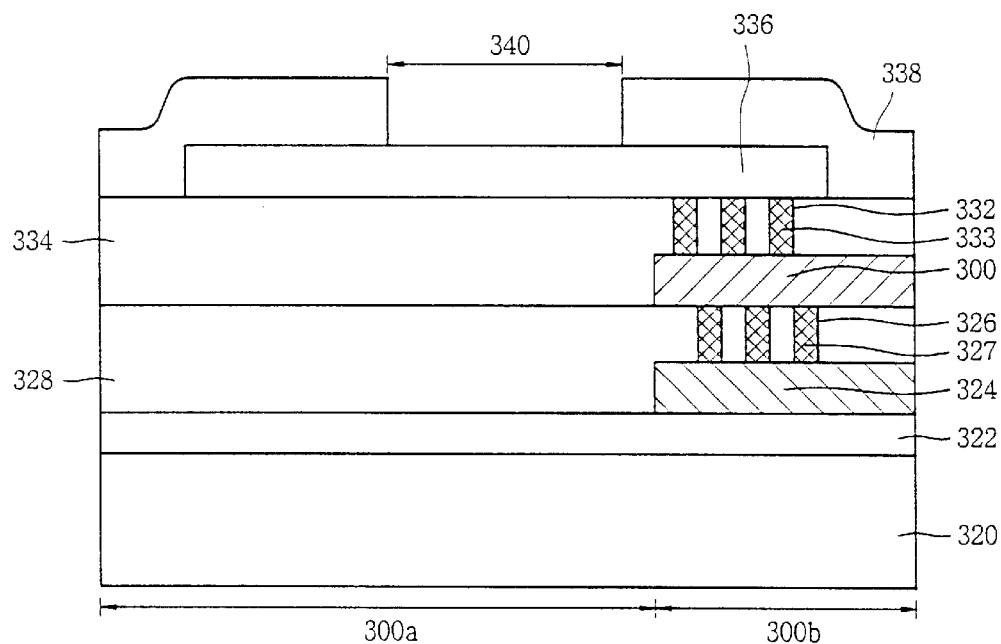

Referring to FIG. 15c, a conductive layer consisting of an Al or a Cu alloy 5500 to 6500 Å thick is formed in the first to third regions on the third interlevel insulating layer 334 and electrically connected to the second conductive plug 333. The conductive layer is then coated with a reflection preventing layer (not shown) having a laminated TiN or Ti/TiN structure 200 to 350 Å thick. The reflection preventing layer and the conductive layer are then selectively etched to expose a defined region of the third interlevel insulating layer 334 in the first and second regions 300a and 300b. Doing so results in the formation of a third conductive pad 336 consisting of a conductive material across the first and second regions 300a and 300b on the third interlevel insulating layer 334. A protective layer 338 is disposed on the third interlevel insulating layer 334 including the third conductive pad 336. The protective layer 338 exposes a defined region of the third conductive pad 336 completing the multi-layered pad 300 of the semiconductor device.

The above-described structure allows the pad forming portion to be free from external stress during wire bonding or electrical testing. The elimination of external stress reduces cracks and increases the contact area of the first and second via holes 326 and 332 to advantageously reduce contact resistance.

Figure 9:
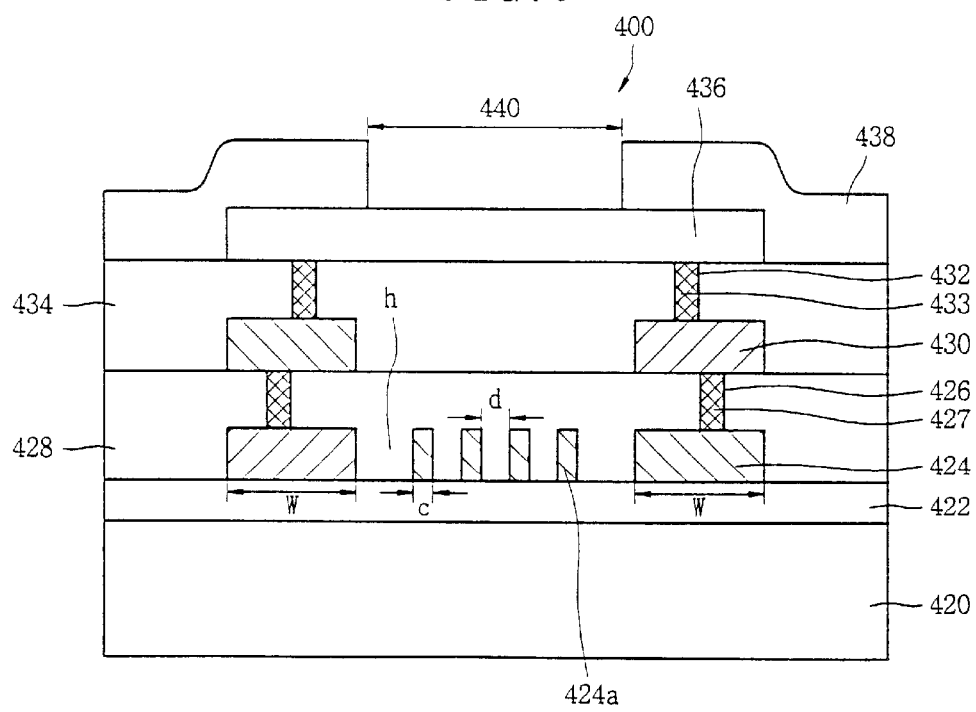
FIG. 9 is a sectional view of a semiconductor device having a multi-layered pad according to a fourth preferred embodiment of the present invention.

FIG. 9 is a sectional view of a semiconductor device having a multi-layered pad in accordance with a fourth preferred embodiment of the present invention. Referring to FIG. 9, the semiconductor device comprises a semiconductor substrate 420 and a first interlevel insulating layer 422 is formed on the semiconductor substrate 420. A first conductive pad 424 is formed in a pad forming region on the first interlevel insulating layer 422. The first conductive pad 424 includes a plurality of through holes h centrally disposed therein. A second interlevel insulating layer 428 is formed on the first interlevel insulating layer 422 including the first conductive pad 424. The second conductive pad 424 includes a first via hole 426 defining a region of the first conductive pad 424 in the edge of a pad window region 440. A first conductive plug 427 is disposed in the first via hole 426. A second conductive pad 430 in the form of closed curve includes a centrally-located wide through hole. The second conductive pad 430 is electrically connected to the first conductive plug 427. A third interlevel insulating layer 334 is formed on the second interlevel insulating layer 428 and includes the second conductive pad 430. A second via hole 432 exposes a region of the second conductive pad 430. A second conductive plug 433 is formed in the second via hole 432. A third conductive pad 436 is formed on a defined region of the third interlevel insulating layer 434 and is electrically connected to the second conductive plug 433. A protective layer 438 is formed on the third interlevel insulating layer 434 including the third conductive pad 436. The protective layer 438 exposes a defined region of the third conductive pad 436. The exposed region of the third conductive pad 436 is the pad window region 440.

The distance c of conductive layer 424a between the two adjacent through holes h formed in the first conductive pad 424 is preferably 1 to 2 μm wide, with each of conductive layers 424a being 2 to 6 μm wide. The first conductive pad 424 connected to the first conductive plug 427 has a width w of between 2 to 3 μm.

Figure 10A:
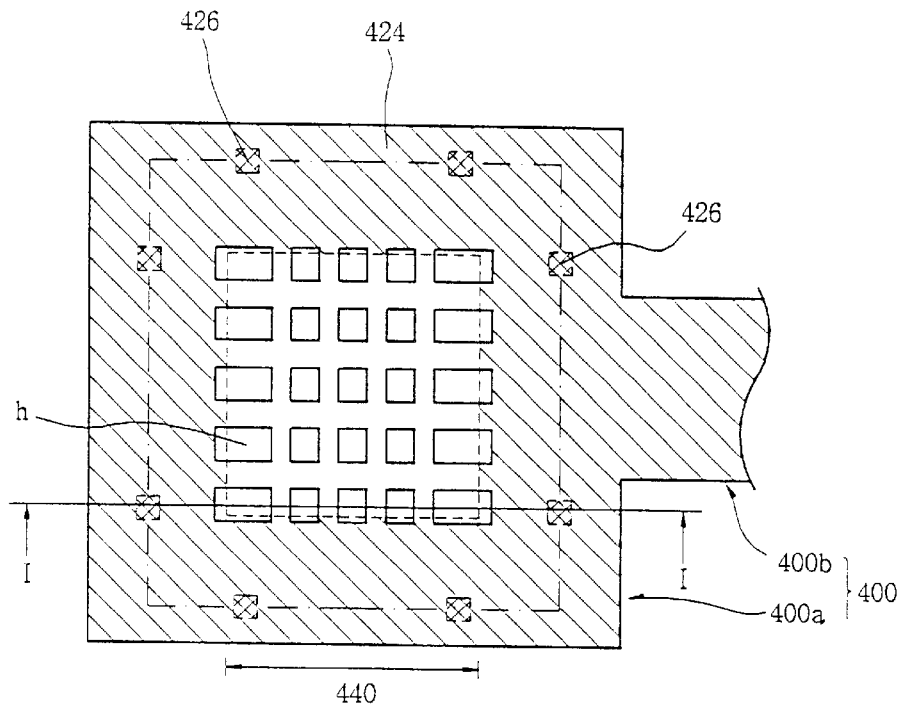
FIGS. 10a and 10b are plan views of the semiconductor device shown in FIG. 9.
Figure 10B:
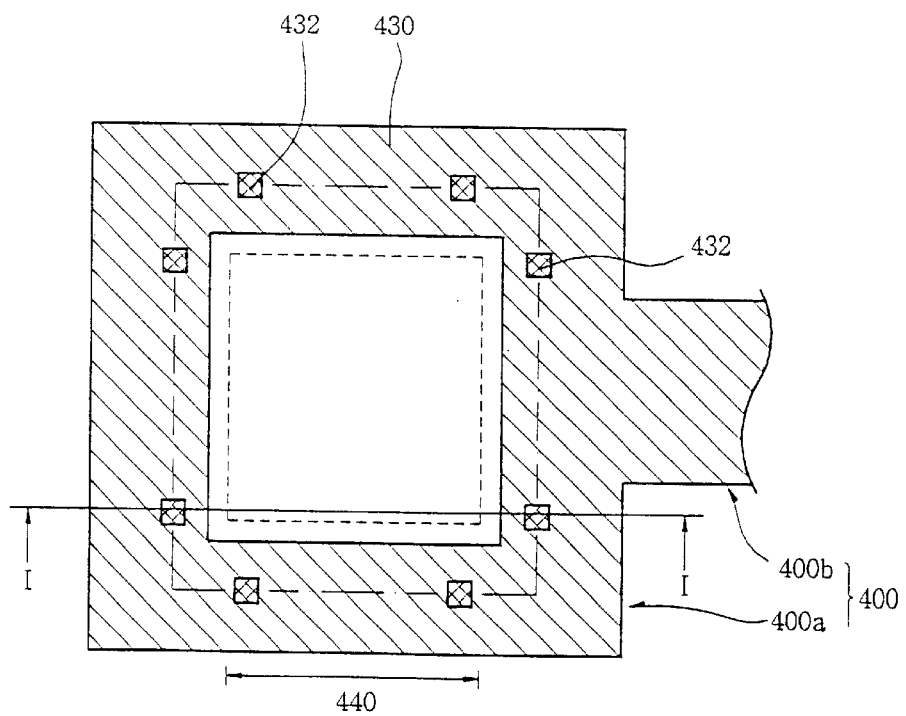

FIGS. 10a and 10b are top plan views of the semiconductor device having the multi-layered pad shown in FIG. 9. FIG. 10a shows the semiconductor device after forming the first conductive pad 424 and the second interlevel insulating layer 428. FIG. 10b illustrates the semiconductor device after forming the second conductive pad 430 and the third interlevel insulating layer 434.

As shown in FIGS. 10a and 10b, the wire bonding region 440 is formed to the right of and underlies the third and first conductive pads 436 and 424a. First and second via holes 426 and 432 are arranged in either an edge array or a bar form. Conductive pads 424a underlie the pad window region 440 to prevent a dishing effect of the interlevel insulating layers. The dishing effect may occur between the conductive pads due to the difference in metal density during smoothing of the interlevel insulating layers. In the second and third interlevel insulating layers 428 and 434, first and second via holes 426 and 432 are alternately disposed in a zigzag manner as shown in the figures but may also be arranged along a straight line.

Figure 16A:
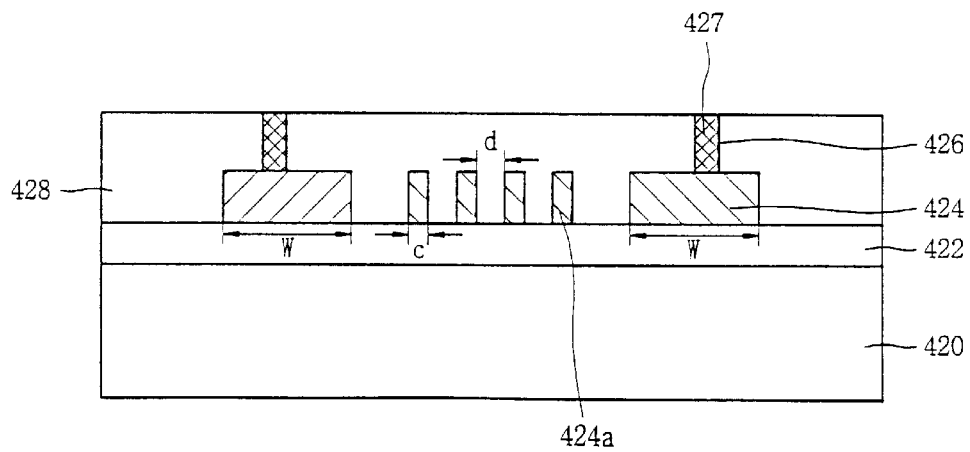
FIGS. 16a to 16c are sequential diagrams of a method for manufacturing the semiconductor device having multi-layered pad according to the fourth embodiment of the present invention.

FIG. 9 is a sectional view taken along the line I—I of FIGS. 10a and 10b, wherein reference numeral 400a denotes a pad forming portion and reference numeral 300b denotes a connection between a cell and the pad forming portion. The semiconductor device having the above-described multi-layer pad a structure is fabricated in three steps that will be described with reference to the sequential diagrams of FIGS. 16a–16c as follows. Referring to FIG. 16a, a first interlevel insulating layer 422, 9000 to 12000 Å thick, is formed and planarized on a semiconductor substrate 420 having a field oxide layer (not shown), transistors (not shown), and capacitors (not shown). A conductive layer consisting of an Al or a Cu alloy 5500 to 6500 Å thick is deposited on the entire surface of the first insulating layer 422. The conductive layer is then coated with a reflection preventing layer (not shown) having a laminated TiN or Ti/TiN structure 200 to 350 Å thick. The conductive layer is selectively etched to form centrally disposed plural through holes h thereby forming a first conductive pad 424 having a plurality of through holes h. On the first interlevel insulating layer 422 including the first conductive pad 424 is formed a second interlevel insulating layer 428 consisting of an oxide material 15000 to 17000 Å thick. The second interlevel insulating layer 428 is selectively photo-etched to form a first via hole 426. The first via hole 426 exposes a defined region of the edge of the first conductive pad 424 (the edge of pad window region 440). A conductive layer consisting of tungsten (W), aluminum, or a copper alloy is then deposited on the second interlevel insulating layer 428 including the first via hole 426 using the CVD method and planarized using the CMP method thereby forming a first conductive plug 427 in the first via hole 426. Where the conductive plug 427 comprises tungsten (W), a barrier metal layer (not shown) having a Ti/TiN laminated structure is required in the first via hole 426 with the view to enhancing the deposition property of layers.

Figure 16B:
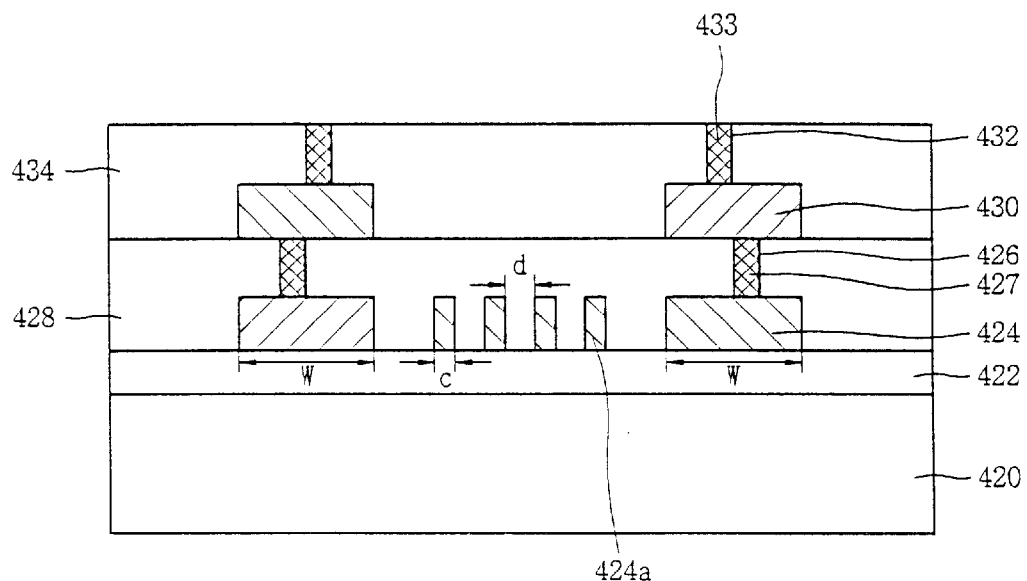

Referring to FIG. 16b, a second conductive pad 430 in the form of closed curve having a centrally disposed wide through hole is formed on the second interlevel insulating layer 428. The second conductive pad 430 is electrically connected to the first conductive plug 427. On the second interlevel insulating layer 428 including the second conductive pad 430 is disposed and planarized a third interlevel insulating layer 434 14000 to 16000 Å thick. The third interlevel insulating layer 434 is selectively etched to form a second via hole 432 thereby exposing a defined region of the second conductive pad 430. A second conductive plug 433 is formed in the second via hole 432 in the same manner as previously described.

Figure 16C:
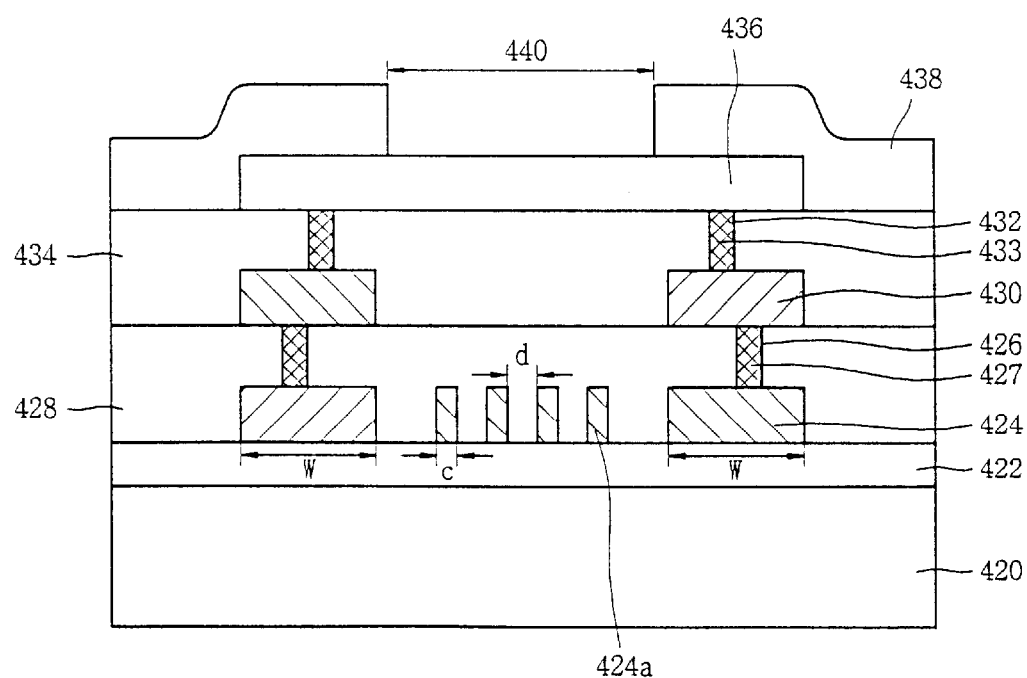

Referring to FIG. 16c, a third conductive pad 436 consisting of an Al or a Cu alloy on the third interlevel insulating layer 334. A protective layer 338 is then disposed on the third interlevel insulating layer 434 including the third conductive pad 436. The protective layer 338 exposes a defined region of the third conductive pad 436 thereby completing a multi-layered pad 400 of the semiconductor device. In the above-described structure, the externally applied stress can be dispersed during a wire bonding or an estimation of electrical properties thereby greatly reducing possible cracks.

Figure 11:
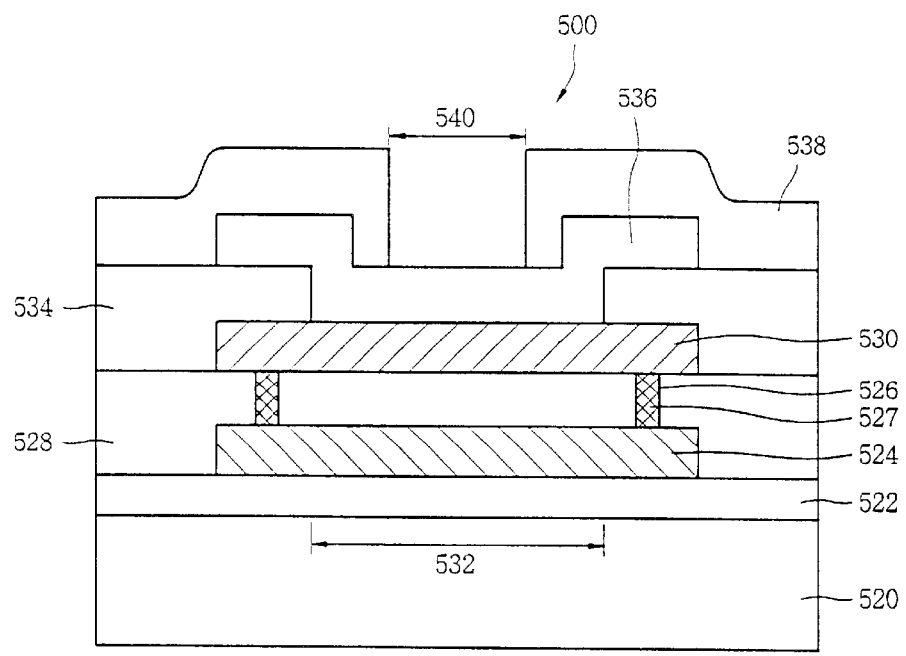
FIG. 11 is a sectional view a semiconductor device having a multi-layered pad according to a fifth preferred embodiment of the present invention.

FIG. 11 is a sectional view of a semiconductor device having a multi-layered pad in accordance with a fifth preferred embodiment of the present invention. Referring to FIG. 11, the semiconductor device comprises a semiconductor substrate 520 and a first interlevel insulating layer 422 formed on the semiconductor substrate 520. A first conductive pad 524a is formed in a pad-forming region on the first interlevel insulating layer 522. A second interlevel insulating layer 528 is formed on the first interlevel insulating layer 522 including the first conductive pad 524. The second interlevel insulating layer 528 includes a first via hole 526 defining a region of the first conductive pad 524. A first conductive plug 527 is disposed in the first via hole 526. A second conductive pad 530 is formed on a defined region of the second interlevel insulating layer 528 and electrically connected to the conductive plug 527. A third interlevel insulating layer 534 is formed on the second interlevel insulating layer 528 including the second conductive pad 530. The third interlevel insulating layer 534 includes a wide via hole 532 defining a region of the second conductive pad 530. A third conductive pad 536 is formed on a defined region of the third interlevel insulating layer 534 including the wide via hole 532. A protective layer 538 is formed on the third interlevel insulating layer 534 including the third conductive pad 536. The protective layer 538 exposes a defined region of the third conductive pad 536. The exposed region of the third conductive pad 536 is pad window region 540 where the conductive pads and leads will be wire-bonded.

Figure 12:
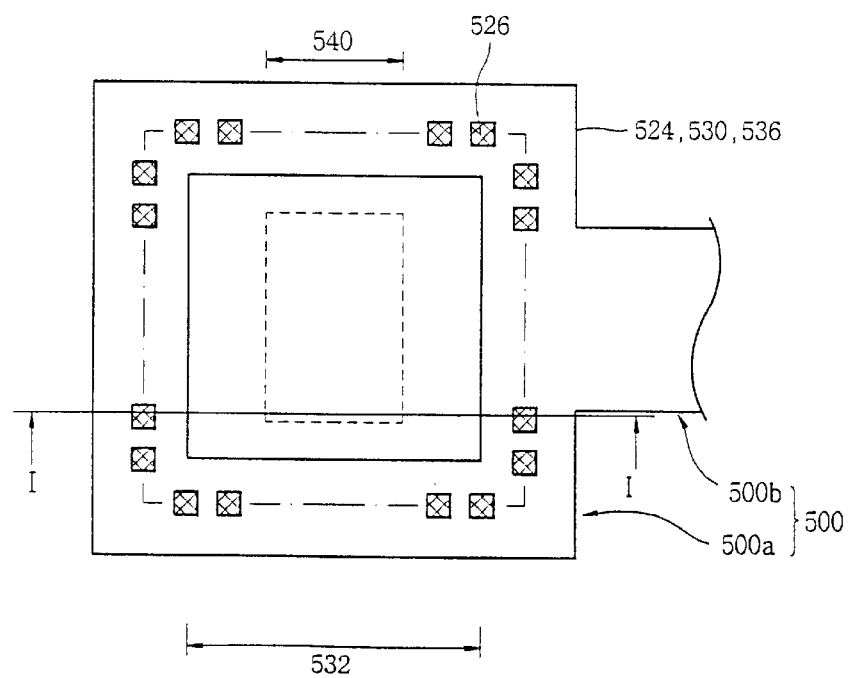
FIG. 12 is a plan view of the semiconductor device shown in FIG. 11.

FIG. 12 is a top plan view of a semiconductor device having the multi-layered pad shown in FIG. 11. As shown in FIGS. 11 and 12, the pad window region 540 is formed in the right direction to the center of the third conductive pad 536 and overlies the first to third conductive pads 524, 530, and 536, respectively. Various layouts are possible to electrically connect the first and second via holes 526 and 532 to the first and second conductive pads 524 and 530, e.g., an edge array structure as shown in FIG. 12 or a bar structure (not shown).

Figure 17A:
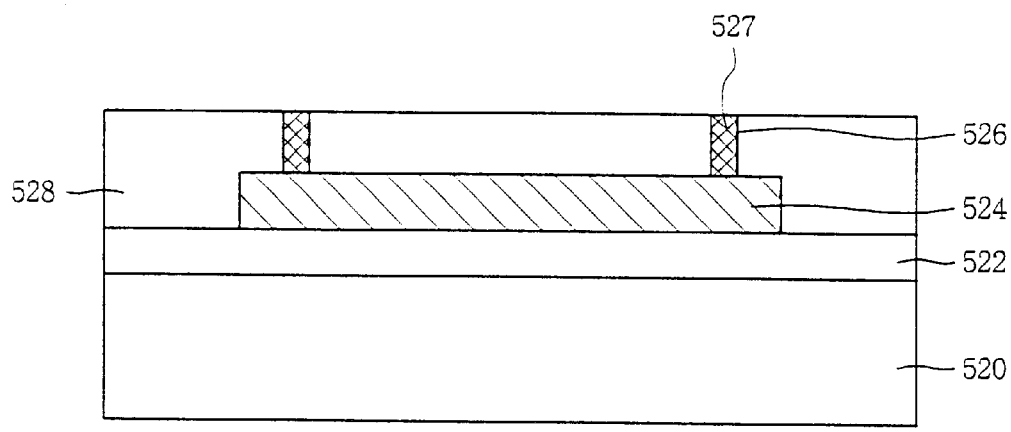
FIGS. 17a to 17c are sequential diagrams of a method for manufacturing the semiconductor device having multi-layered pad according to the fifth embodiment of the present invention.

FIG. 11 is a sectional view taken along the line I—I of FIG. 12, wherein reference numeral 500a denotes a pad forming portion and reference numeral 500*b* designates a connection between a cell and the pad forming portion. The semiconductor device having the above-described multi-layer pad structure is fabricated in three steps that will be described with reference to the sequential diagrams of FIGS. 17*a*–17*c* as follows. Referring to FIG. 17*a*, a first interlevel insulating layer 522, 9000 to 12000 Å thick, is formed and planarized on a semiconductor substrate 520 having a field oxide layer (not shown), transistors (not shown), and capacitors (not shown). On the whole surface of the first interlevel insulating layer 522 is deposited a conductive layer consisting of an Al or a Cu alloy 5500 to 6500 Å thick. The conductive layer is then coated with a reflection preventing layer (not shown) having a laminated TiN or Ti/TiN structure 200 to 350 Å thick. The reflection preventing layer and the conductive layer are selectively photo-etched to expose a defined region of the first interlevel insulating layer 522 thereby forming a first conductive pad 524. A second interlevel insulating layer 528 consisting of an oxide material between 15000 and 17000 Å thick is formed on the first interlevel insulating layer 522 including the first conductive pad 524. The second interlevel insulating layer 528 is selectively photo-etched to form a via hole 526 thereby exposing a defined region of the edge of the first conductive pad 524 (the edge of pad window region 540). A conductive layer consisting of tungsten (W), aluminum, or a copper alloy is then deposited on the second interlevel insulating layer 528 including the via hole 526 using CVD method and planarized using the CMP method thereby forming a conductive plug 527 in the via hole 526. Where the conductive plug 527 comprises tungsten (W), a barrier metal layer (not shown) having a Ti/TiN laminated structure is required in the via hole 526 with the view to enhancing the deposition property of layers.

Figure 17B:
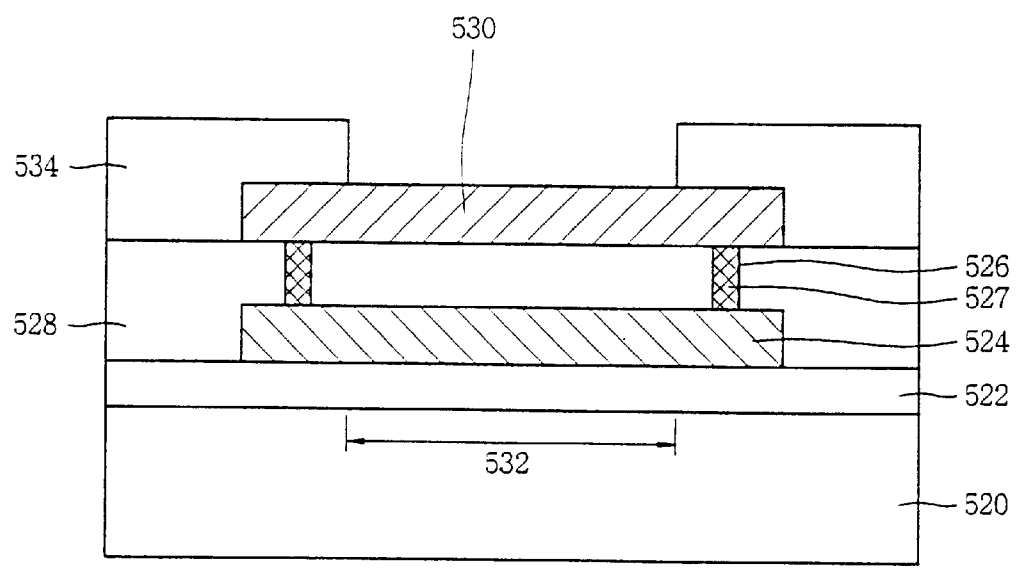

Referring to FIG. 17*b*, a second conductive pad 530 consisting of Al or a Cu alloy is formed in a defined region of the second interlevel insulating layer 528. The conductive pad 530 is electrically connected to the conductive plug 527. On the second interlevel insulating layer 528 including the second conductive pad 530 is disposed and planarized a third interlevel insulating layer 534 consisting of an oxide material 14000 to 16000 Å thick. The third interlevel insulating layer 534 selectively etched to form a wide via hole 532 thereby exposing a defined region of the center of the second conductive pad 530. At this stage, the second conductive pad 530 is as large as the first conductive pad 524 and the other process conditions are analogous to the first step shown in FIG. 17*a*.

Figure 17C:
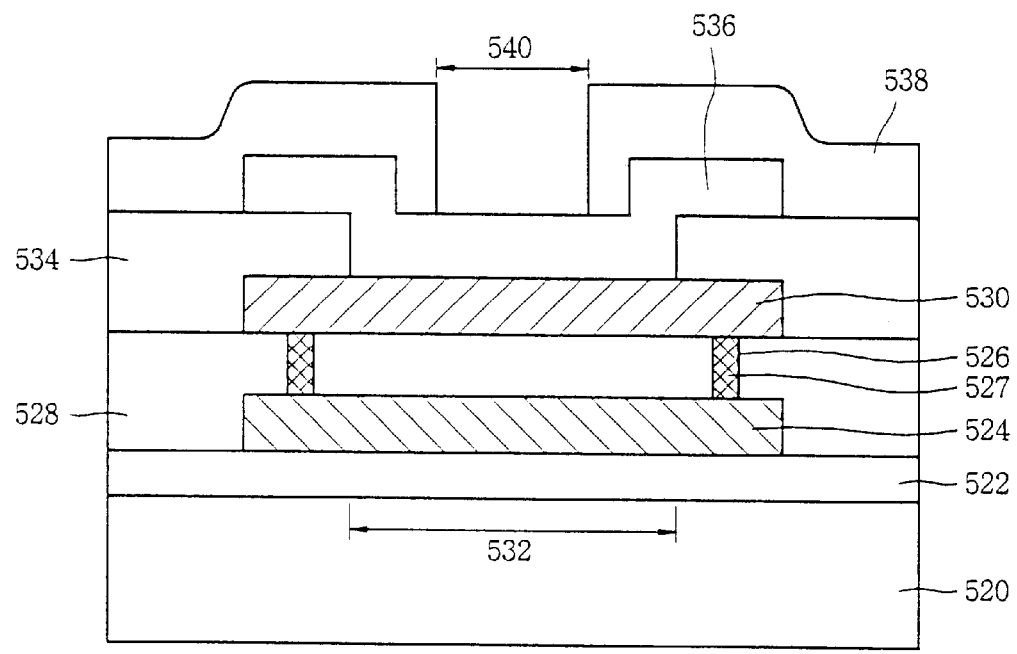

Referring to FIG. 17*c*, a third conductive pad 536 consisting of an Al or a Cu alloy is formed on the third interlevel insulating layer 534 including the wide via hole 532 in the same manner as the first step shown in FIG. 17*a*. A protective layer 538 is then disposed on the entire surface of the third interlevel insulating layer 534, exposing the center of the conductive pad 536 thereby completing a multi-layered pad 500 of the semiconductor device.

In the above-described a structure, the second conductive pad 530 underlying the third conductive pad 536 makes the pads of the wire bonding region thick enough to decrease deformation of pads and reduce cracks in the interlevel insulating layers that may be caused by the stress imposed on the pads during a probing. Additionally, the process is relatively simple reducing the production costs.

The multi-layered pad structure of a semiconductor device according to the first to fifth preferred embodiments can be employed in the manufacture of a semiconductor device having four- and five-layered wiring structure as well as the above-described three-layered wiring.

According to a variation of the first to fifth preferred embodiments, on the third interlevel insulating layer including the third conductive pad, the multi-layered pad may further have a fourth interlevel insulating layer having a wide via hole exposing a defined region of the conductive pads, and a fourth conductive pad connected to the third conductive pad through the wide via hole.

Prior to formation of the protective layer, the step of forming the fourth interlevel insulating layer having the wide via hole and the fourth conductive pad is analogous to above-described process, i.e., the second and third steps in the fifth embodiment.

According to the first and second embodiments, the first and second via holes are formed only along the edge on the one side of the wire bonding region so that it is possible to decrease cracks in the insulating layers to a quarter even when gold balls are not precisely aligned but turned aside from the center of the wire bonding region during a wire bonding.

According to the third embodiment, via contact boles are formed in the connection line between the cell and pad forming portions, allowing the bonding pad to be free from external stress and reducing potential cracks. Furthermore, the via holes are arranged in a bar form to decrease the contact resistance.

According to the fourth embodiment, it is possible to disperse the stress externally applied during a wire bonding or test probing thereby greatly reducing potential cracks in the insulating layers.

According to the fifth embodiment, the final pad in the wire bonding region becomes thick enough without adding complex process steps due to a laminated structure of the second and third conductive pads that leads to reduction of cracks in the interlevel insulating layers and curtailment of production cost.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A semiconductor device having a multi-layered pad, comprising:

a first interlevel insulating layer formed on a semiconductor substrate;

a first conductive pad formed on the first interlevel insulating layer, the first conductive pad extending lengthwise along a first edge on a first side of a pad window region;

a second interlevel insulating layer formed on the first interlevel insulating layer having a first via hole exposing a defined region of the first conductive pad;

a first conductive plug formed in the first via hole;

a second conductive pad formed on the second interlevel insulating layer, the second conductive pad extending lengthwise along the first edge on the first side of the pad window region and being electrically coupled to the first conductive plug;

a third interlevel insulating layer formed on the second interlevel insulating layer having a second via hole exposing a defined region of the second conductive pad;

a second conductive plug formed in the second via hole;

a third conductive pad formed on a defined region of the third interlevel insulating layer, the third conductive pad being electrically coupled to the second conductive plug; and a plurality of buffer layers formed on at least one of the first and second interlevel insulating layers under the pad window region at substantially the same time as the first or second conductive pads, the plurality of buffer layers being a same material as the first or second conductive pads.

2. The semiconductor device according to claim 1 wherein the plurality of buffer layers are arranged in a mosaic layout.

3. The semiconductor device according to claim 1 wherein a distance between two adjacent buffer layers is between about 0.7 to 0.8 µm and wherein each of the plurality of buffer layers is about 0.4 to 0.6 µm wide.

4. The semiconductor device according to claim 1 wherein the plurality of buffer layers are formed of a buffer layer material different from an insulating layer material used to form the first, second, and third interlevel insulating layers.

5. The semiconductor device according to claim 4 wherein the plurality of buffer layers and the first or second conductive pads are aluminum.

6. The semiconductor device according to claim 4 wherein the plurality of buffer layers and the first or second conductive pads are a copper alloy.

7. The semiconductor device according to claim 4 wherein the plurality of buffer layers and the first or second conductive pads are polysilicon.

8. A semiconductor device having a multi-layered pad, comprising:

a first interlevel insulating layer formed on a semiconductor substrate;

a first conductive pad formed on the first interlevel insulating layer, the first conductive pad extending lengthwise along a first edge on a first side of a pad window region;

a second interlevel insulating layer formed on the first interlevel insulating layer having a first via hole exposing a defined region of the first conductive pad;

a first conductive plug formed in the first via hole;

a second conductive pad formed on the second interlevel insulating layer, the second conductive pad extending lengthwise along the first edge on the first side of the pad window region and being electrically coupled to the first conductive plug, the first and second conductive pads being arranged in a bar form;

a third interlevel insulating layer formed on the second interlevel insulating layer having a second via hole exposing a defined region of the second conductive pad;

a second conductive plug formed in the second via hole;

a third conductive pad formed on a defined region of the third interlevel insulating layer, the third conductive pad being electrically coupled to the second conductive plug; and a plurality of buffer layers formed on at least one of the first and second interlevel insulating layers under the pad window region at substantially the same time as the first or second conductive pads.

* * * * *